United States Patent
Conrad et al.

(10) Patent No.: US 8,912,830 B2
(45) Date of Patent: Dec. 16, 2014

(54) METHOD AND APPARATUS FOR ATOMIC FREQUENCY AND VOLTAGE CHANGES

(75) Inventors: Shaun M. Conrad, Cornelius, OR (US); Jeremy J. Shrall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,693

(22) PCT Filed: Mar. 28, 2012

(86) PCT No.: PCT/US2012/030995
§ 371 (c)(1),
(2), (4) Date: Jun. 27, 2013

(87) PCT Pub. No.: WO2013/147770
PCT Pub. Date: Oct. 3, 2013

(65) Prior Publication Data
US 2014/0159785 A1    Jun. 12, 2014

(51) Int. Cl.
*H03L 7/06* (2006.01)
*G06F 1/32* (2006.01)
*H03L 7/00* (2006.01)
*H03K 3/012* (2006.01)

(52) U.S. Cl.
CPC ............. *H03K 3/012* (2013.01); *G06F 1/324* (2013.01); *H03L 7/00* (2013.01); *G06F 1/3243* (2013.01)

USPC ........... 327/147; 327/291; 327/298; 327/299; 713/322; 713/323

(58) Field of Classification Search
CPC ..... H03K 3/012; G06F 1/3243; G06F 1/3203; G06F 1/26
USPC ........... 327/147, 291, 298, 299; 713/322, 323
See application file for complete search history.

(56) References Cited

U.S. PATENT DOCUMENTS

| | | |
|---|---|---|
| 7,263,457 B2 | 8/2007 | White et al. |
| 8,010,817 B2 | 8/2011 | Chu et al. |
| 2006/0282692 A1 | 12/2006 | Oh |
| 2012/0042176 A1 | 2/2012 | Kim |

OTHER PUBLICATIONS

International Search Report and Written Opinion for PCT Patent Application No. PCT/US2012/030995 Mailed Oct. 31, 2012, 9 Pages.

*Primary Examiner* — John Poos
(74) *Attorney, Agent, or Firm* — Blakely, Sokoloff, Taylor & Zafman LLP

(57) ABSTRACT

A method and apparatus for atomic frequency and voltage changes in the processor. In one embodiment of the invention, the atomic frequency and voltage changes in the processor is feasible due to the enabling technology of fully integrated voltage regulators (FIVR) that are integrated in the processor. FIVR allows independent configuration of each core in the processor and the configuration includes, but is not limited to, voltage setting, frequency setting, clock setting and other parameters that affects the power consumption of each core.

21 Claims, 2 Drawing Sheets

METHOD AND APPARATUS FOR ATOMIC FREQUENCY AND VOLTAGE CHANGES

CLAIM OF PRIORITY

This application is a U.S. National Phase application under 35 U.S.C. §371 of International Application No. PCT/US2012/030995, filed Mar. 28, 2012, entitled "METHOD AND APPARATUS FOR ATOMIC FREQUENCY AND VOLTAGE CHANGES," the entire contents of which are incorporated herein by reference.

FIELD OF THE INVENTION

This disclosure pertains to a processor, as well as code to execute thereon, and in particular but not exclusively, to a method and apparatus for atomic frequency and voltage changes in the processor.

BACKGROUND DESCRIPTION

In some processors, a ratio change of the clock source requires the voltage source of the processor and the ratio of the clock source to change in a certain order with each other. For example, in order to change the clock source to a higher frequency, the voltage source of the processor first has to be raised. The processor waits for the voltage source to be raised and once the voltage source of the processor has been raised to the new level, the ratio of the clock source can be changed to increase the frequency of the clock source.

The current sequence of steps described earlier to change the ratio of the clock source is not optimal as there is a long delay in the waiting time.

BRIEF DESCRIPTION OF THE DRAWINGS

The features and advantages of embodiments of the invention will become apparent from the following detailed description of the subject matter in which.

DETAILED DESCRIPTION

Figure 1:
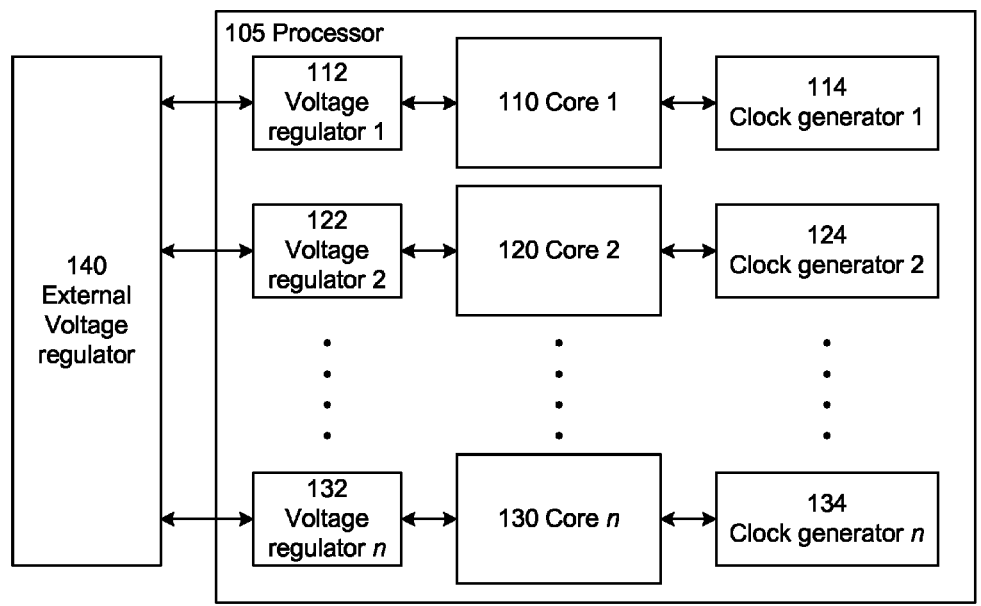
FIG. 1 illustrates the block diagram of a processor in accordance with one embodiment of the invention.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and apparatus for atomic frequency and voltage changes in a processor. In one embodiment of the invention, the atomic frequency and voltage changes in the processor is feasible due to the enabling technology of fully integrated voltage regulators (FIVR) that are integrated in the processor. FIVR allows independent configuration of each core in the processor and the configuration includes, but is not limited to, voltage setting, frequency setting, clock setting and other parameters that affects the power consumption of each core. The processor comprises one or more processing or logic cores in one embodiment of the invention.

FIG. 1 100 illustrates the block diagram of a processor 105 in accordance with one embodiment of the invention. The processor 105 has core 1 110 and core 2 120. The core n 130 illustrates that the processor 105 can have any number of cores. Each of the cores in the processor 105 is coupled with a voltage regulator and a clock generator. For example, in one embodiment of the invention, the core 1 110 is coupled with the voltage regulator 1 112 and the clock generator or source 1 114. The core 2 120 is coupled with the voltage regulator 2 122 and the clock generator 21 124. The voltage regulator n 132 and clock generator n 134 are coupled with the core n 130.

The voltage regulators 1 112, 2 122, and n 132 are coupled with an external voltage regulator 140 in one embodiment of the invention. The voltage regulators 1 112, 2 122, and n 132 each provide one or more separate power domains to their respective cores. The clock generators 1 114, 2 124, and n 134 each provide one or more separate clocks to their respective cores. The integration of the voltage regulators and the clock generators into the processor 105 enable each core to perform an atomic ratio change of its clock generator in one embodiment of the invention. By doing so, it improves the performance of the processor 105 and reduces the power consumption to change clock ratio of the clock generators.

FIG. 1 100 is not meant to be limiting and the processor 105 can have any number of cores in another embodiment of the invention. In one embodiment of the invention, the cores are of the same type, i.e., homogeneous cores. The cores may also be of different types, i.e., heterogeneous cores in another embodiment of the invention. The cores may also include one or more graphics processing units (GPUs) in one embodiment of the invention. In one embodiment of the invention, the cores are able to change its atomic ratio change of its clock in parallel with each other and at the same time, enter or exit different processor states (C-states). By doing so, the processor 105 can perform optimizations such as not having to change the clock ratios on active cores before waking sleeping cores.

In one embodiment of the invention, one voltage regulator can be coupled to more than one core. In another embodiment of the invention, one clock generator can be coupled to more than one core. One of ordinary skill in the relevant art will readily appreciate that the processor 105 can have different configurations without affecting the workings of the invention.

Figure 2:
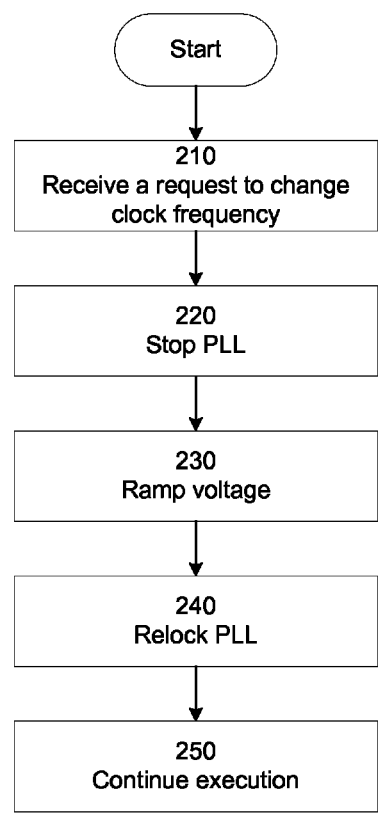
FIG. 2 illustrates the operations to change the clock ratio in a processor in accordance with one embodiment of the invention.

FIG. 2 200 illustrates the operations to perform atomic clock ratio change in a processor in accordance with one embodiment of the invention. For clarity of illustration, FIG. 2 is discussed with reference to FIG. 1. In step 210, the processor 105 receives a request to change the clock frequency or ratio of one or more of its cores. For ease of illustration, the core 1 110 is assumed to receive a request to change the clock frequency of one or more of the clocks provided by the clock generator or source 1 114.

In step 220, the core 1 110 stops the clock(s) that was requested to change its frequency. The clock generator 1 114 includes, but is not limited to, a phase locked loop (PLL), a delayed PLL (DLL) and other clock sources. In one embodiment of the invention, when clock generator 1 114 is a PLL or a DLL, the core 1 110 stops the clock by deactivating the reference clock to the PLL or DLL. One of ordinary skill in the relevant art will readily appreciate that there are other ways to stop the clock generator 1 114 and these other ways can be used without affecting the workings of the invention.

In step 230, the core 1 110 ramps or changes the voltage provided by the voltage regulator 1 112 to a level that supports the requested clock frequency. In one embodiment of the invention, the core 1 110 sends a voltage identification (VID) associated with the level that supports the request clock ratio or frequency to the voltage regulator 1 112. Once the voltage change in step 230 has been completed, the core 1 110 changes the clock(s) to the requested frequency in step 240. For example, in one embodiment of the invention, when clock generator 1 114 is a PLL or a DLL, the core 1 110 changes the ratio of the clock and waits for the PLL or DLL to lock to the requested frequency.

When the clock(s) has changed to the requested frequency, the core 1 110 continues its execution in step 250. The operations described for core 1 110 applies for the other cores in the processor 105 and shall not be described herein. The operations illustrated in FIG. 2 require less time to change the frequency of the clock(s) in one embodiment of the invention. This is because there is no long delay to wait for the voltage to change to the level that supports the requested frequency.

Figure 3:
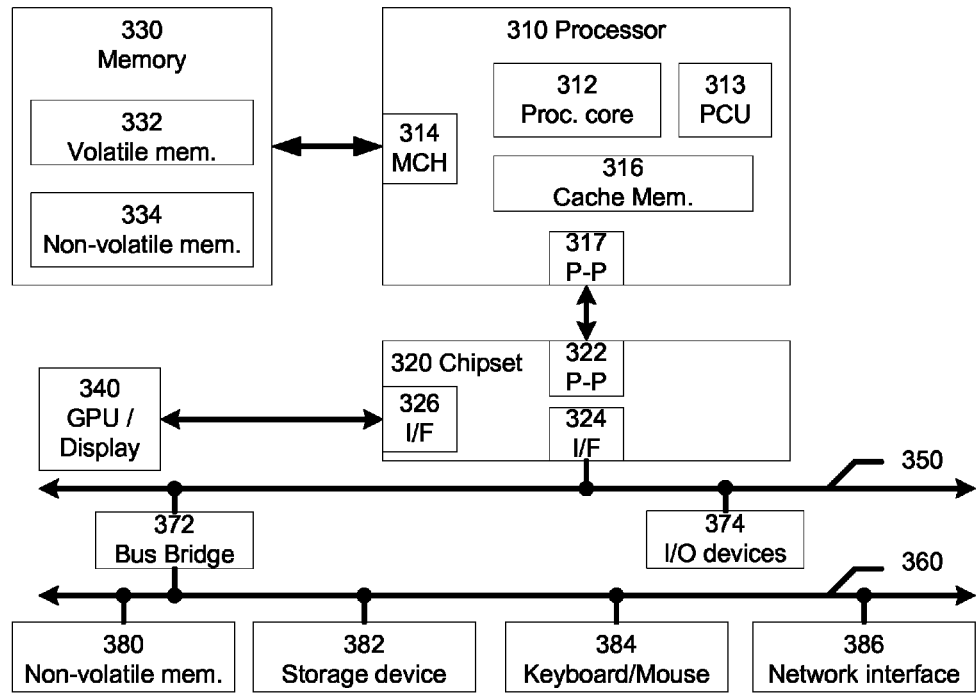
FIG. 3 illustrates a system to implement the methods disclosed herein in accordance with one embodiment of the invention.

FIG. 3 illustrates a system or platform 300 to implement the methods disclosed herein in accordance with one embodiment of the invention. The system 300 includes, but is not limited to, a desktop computer, a tablet computer, a laptop computer, a netbook, a notebook computer, a personal digital assistant (PDA), a server, a workstation, a cellular telephone, a mobile computing device, a smart phone, an Internet appliance or any other type of computing device. In another embodiment, the system 300 used to implement the methods disclosed herein may be a system on a chip (SOC) system.

The processor 310 has a processing core 312 to execute instructions of the system 300. The processing core 312 includes, but is not limited to, fetch logic to fetch instructions, decode logic to decode the instructions, execution logic to execute instructions and the like. The processor 310 has a cache memory 316 to cache instructions and/or data of the system 300. In another embodiment of the invention, the cache memory 316 includes, but is not limited to, level one, level two and level three, cache memory or any other configuration of the cache memory within the processor 310.

The memory control hub (MCH) 314 performs functions that enable the processor 310 to access and communicate with a memory 330 that includes a volatile memory 332 and/or a non-volatile memory 334. The volatile memory 332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 334 includes, but is not limited to, NAND flash memory, phase change memory (PCM), read only memory (ROM), electrically erasable programmable read only memory (EEPROM), or any other type of non-volatile memory device.

The memory 330 stores information and instructions to be executed by the processor 310. The memory 330 may also stores temporary variables or other intermediate information while the processor 310 is executing instructions. The chipset 320 connects with the processor 310 via Point-to-Point (PtP) interfaces 317 and 322. The chipset 320 enables the processor 310 to connect to other modules in the system 300. In another embodiment of the invention, the chipset 320 is a platform controller hub (PCH). In one embodiment of the invention, the interfaces 317 and 322 operate in accordance with a PtP communication protocol such as the Intel® QuickPath Interconnect (QPI) or the like. The chipset 320 connects to a GPU or a display device 340 that includes, but is not limited to, liquid crystal display (LCD), cathode ray tube (CRT) display, or any other form of visual display device. In another embodiment of the invention, the GPU 340 is not connected to the chipset 320 and is part of the processor 310 (not shown).

In addition, the chipset 320 connects to one or more buses 350 and 360 that interconnect the various modules 374, 380, 382, 384, and 386. Buses 350 and 360 may be interconnected together via a bus bridge 372 if there is a mismatch in bus speed or communication protocol. The chipset 320 couples with, but is not limited to, a non-volatile memory 380, a mass storage device(s) 382, a keyboard/mouse 384 and a network interface 386. The mass storage device 382 includes, but is not limited to, a solid state drive, a hard disk drive, an universal serial bus flash memory drive, or any other form of computer data storage medium. The network interface 386 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. The system 300 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A processor comprising:
a plurality of voltage regulators;
a plurality of clock generators; and
a plurality of cores, wherein each core is coupled with a respective one of the plurality of voltage regulators and a respective one of the plurality of clock generators, and wherein at least one core is to perform an atomic ratio change of the respective one clock generator.

2. The processor of claim 1, wherein the at least one core is further to receive a request to change a first clock ratio of the respective one clock generator to a second clock ratio, and wherein the at least one core to perform the atomic ratio change of the respective one clock generator is to perform the atomic ratio change of the respective one clock generator in response to receiving the request to change the first clock ratio of the respective one clock generator to the second clock ratio.

3. The processor of claim 1, wherein each clock generator comprises a phase locked loop or a delayed phase locked loop.

4. The processor of claim 2, wherein the at least one core to perform the atomic ratio change of the respective one clock generator is to change the first clock ratio of the respective one clock generator to the second clock ratio without first changing the voltage of the respective one voltage regulator.

5. The processor of claim 4, wherein the at least one core to change the first clock ratio of the respective one clock generator to the second clock ratio without first changing the voltage of the respective one voltage regulator is to:
stop the respective one clock generator in response to receiving the request to change the first clock ratio of the respective one clock generator to the second clock ratio;
change the voltage of the respective one voltage regulator to a level that supports the second clock ratio; and
change the first clock ratio of the respective one clock generator to the second clock ratio.

6. The processor of claim 4, wherein the at least one core to change the first clock ratio of the respective one clock generator to the second clock ratio without first changing the voltage of the respective one voltage regulator is further to determine that the respective one clock generator is locked.

7. The processor of claim 5, wherein the at least one core to change the voltage of the respective one voltage regulator to the level that supports the second clock ratio is to:
send a voltage identification (VID) associated with the level that supports the second clock ratio to the respective one voltage regulator.

8. A system comprising:
a memory; and
a processor comprising:
a plurality of voltage regulators;
a plurality of clock generators; and
a plurality of cores, wherein each core is coupled with a respective one of the plurality of voltage regulators and a respective one of the plurality of clock generators, and wherein each core is to perform an atomic ratio change of the respective one clock generator.

9. The system of claim 8, wherein each core is further to receive a request to change a first clock ratio of the respective one clock generator to a second clock ratio, and wherein each core to perform the atomic ratio change of the respective one clock generator is to perform the atomic ratio change of the respective one clock in response to receiving the request to change the first clock ratio of the respective one clock generator to the second clock ratio.

10. The system of claim 8, wherein each clock generator comprises a phase locked loop or a delayed phase locked loop.

11. The system of claim 8, wherein each core to perform the atomic ratio change of the respective one clock generator is to change the first clock ratio of the respective one clock generator to the second clock ratio without first changing the voltage of the respective one voltage regulator.

12. The system of claim 11, wherein each core to change the first clock ratio of the respective one clock generator to the second clock ratio without first changing the voltage of the respective one voltage regulator is to:
stop the respective one clock generator in response to receiving the request to change the first clock ratio of the respective one clock generator to the second clock ratio;
change the voltage of the respective one voltage regulator to a level that supports the second clock ratio; and
change the first clock ratio of the respective one clock generator to the second clock ratio.

13. The system of claim 11, wherein each core to change the first clock ratio of the respective one clock generator to the second clock ratio without first changing the voltage of the respective one voltage regulator is further to determine that the respective one clock generator is locked.

14. The system of claim 12, wherein each core to change the voltage of the respective one voltage regulator to the level that supports the second clock ratio is to:
send a voltage identification (VID) associated with the level that supports the second clock ratio to the respective one voltage regulator.

15. A method comprising:
performing, by one of a plurality of cores, each core coupled with a respective one of a plurality of voltage regulators and a respective one of a plurality of clock generators, an atomic ratio change of the respective one clock generator.

16. The method of claim 15, further comprising:
receiving, by each core, a request to change a first clock ratio of the respective one clock generator to a second clock ratio, and wherein performing, by each core, the atomic ratio change of the respective one clock generator comprises performing, by each core, the atomic ratio change of the respective one clock generator in response to receiving the request to change the first clock ratio of the respective one clock generator to the second clock ratio.

17. The method of claim 15, wherein each clock generator comprises a phase locked loop or a delayed phase locked loop.

18. The method of claim 15, wherein performing the atomic ratio change of the respective one clock generator comprises changing the first clock ratio of the respective one clock generator to the second clock ratio without first changing the voltage of the respective one voltage regulator.

19. The method of claim 18, wherein changing the first clock ratio of the respective one clock generator to the second clock ratio without first changing the voltage of the respective one voltage regulator comprises:
   stopping the respective one clock generator in response to receiving the request to change the first clock ratio of the respective one clock generator to the second clock ratio;
   changing the voltage of the respective one voltage regulator to a level that supports the second clock ratio; and
   changing the first clock ratio of the respective one clock generator to the second clock ratio.

20. The method of claim 18, wherein changing the first clock ratio of the respective one clock generator to the second clock ratio without first changing the voltage of the respective one voltage regulator comprises determining that the respective one clock generator is locked.

21. The method of claim 19, wherein changing the voltage of the respective one voltage regulator to the level that supports the second clock ratio comprises:
   sending a voltage identification (VID) associated with the level that supports the second clock ratio to the respective one voltage regulator.

* * * * *